(12) United States Patent
Ulmer et al.

(10) Patent No.: US 8,796,083 B2
(45) Date of Patent: Aug. 5, 2014

(54) FLUOROPOLYMER MASK FOR TRANSISTOR CHANNEL DEFINITION

(75) Inventors: Kurt Ulmer, Vancouver, WA (US); Kanan Puntambekar, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 13/471,799

(22) Filed: May 15, 2012

(65) Prior Publication Data

US 2013/0307073 A1    Nov. 21, 2013

(51) Int. Cl.
*H01L 51/00* (2006.01)
*H01L 21/288* (2006.01)
*H01L 29/417* (2006.01)

(52) U.S. Cl.
CPC ........... *H01L 51/0022* (2013.01); *H01L 21/288* (2013.01); *H01L 29/41733* (2013.01)
USPC ........... 438/197; 439/149; 439/497; 439/584; 427/97.5

(58) Field of Classification Search
CPC .............. H01L 51/0022; H01L 21/288; H01L 29/41733
USPC ........... 438/141, 149, 151, 584, 99, 161, 164, 438/197, 478, 689, 780, 492, 496
See application file for complete search history.

(56) References Cited

U.S. PATENT DOCUMENTS

| | | | |
|---|---|---|---|
| 6,838,361 B2 | 1/2005 | Takeo | |
| 7,364,996 B2 * | 4/2008 | Kawase | 438/584 |
| 7,365,022 B2 | 4/2008 | Wong et al. | |
| 7,407,849 B2 * | 8/2008 | Sirringhaus et al. | 438/197 |
| 7,749,916 B2 | 7/2010 | Wong et al. | |

(Continued)

FOREIGN PATENT DOCUMENTS

| | | |
|---|---|---|
| EP | 2323190 | 5/2011 |
| WO | WO2004055919 | 7/2004 |
| WO | WO2011004198 | 1/2011 |

OTHER PUBLICATIONS

Moon H, et al., Bilayer source/drain electrodes self-aligned with fluoropolymer dielectrics for stable high-performance organic TFTs, IEEE Electron Device Lett., 32, 1137-1139. (2011).*

(Continued)

*Primary Examiner* — Allen Parker
*Assistant Examiner* — Gardner W Swan
(74) *Attorney, Agent, or Firm* — Law Office of Gerald Maliszewski; Gerald Maliszewski (57) ABSTRACT

A method is provided for controlling the channel length in a thin-film transistor (TFT). The method forms a printed ink first source/drain (S/D) structure overlying a substrate. A fluoropolymer mask is deposited to cover the first S/D structure. A boundary region is formed between the edge of the fluoropolymer mask and the edge of the printed ink first S/D structure, having a width. Then, a primary ink is printed at least partially overlying the boundary region, forming a printed ink second S/D structure, having an edge adjacent to the fluoropolymer mask edge. After removing the fluoropolymer mask, the printed ink first S/D structure edge is left separated from the printed ink second S/D structure edge by a space equal to the boundary region width. A semiconductor channel is formed partially overlying the first and second S/D structures, having a channel length equal to the boundary region width.

23 Claims, 5 Drawing Sheets

(56) References Cited

U.S. PATENT DOCUMENTS

| | | | |
|---|---|---|---|
| 8,227,278 B2* | 7/2012 | Sasagawa et al. | 438/34 |
| 2006/0231829 A1* | 10/2006 | Wu et al. | 257/40 |
| 2010/0244016 A1* | 9/2010 | Kim et al. | 257/40 |

OTHER PUBLICATIONS

Jones B, Fluoropolymers for coating applications, Halocarbon Products Corporation (pre-publication ver. of JCT CoatingsTech article, accessed via http://www.halocarbon.com/technical.php on Nov. 20, 2013), 2008.*

* cited by examiner

FLUOROPOLYMER MASK FOR TRANSISTOR CHANNEL DEFINITION

BACKGROUND OF THE INVENTION

1. Field of the Invention

This invention generally relates to integrated circuit (IC) fabrication and, more particularly, to a process that uses a fluoropolymer film as a method of defining the spacing between adjacent printed ink structures.

2. Description of the Related Art

Metal lines are commonly formed in printed electronic applications by inkjet printing of metal nanoparticle or metal precursor inks onto a substrate. The line width and line shape are dictated by the printed volume of ink and the interaction of the ink with the surface of the substrate. It is important to tailor the surface energy of the substrate for a specific ink to achieve the desired line characteristics. In order to create a thin film transistor (TFT) by inkjet printing, two inkjet printed metal layers are typically required: a gate metal and source/drain metal. The source/drain print characteristics are of particular interest because they typically determine the transistor channel length (L)

The accuracy of inkjet drop placement limits how far down the channel lengths can reasonably be scaled while preserving device yield. Misplaced drops can cause the printed source and drain lines to merge, for example, and cause an electrical short. There are many factors that affect drop placement. Some of these factors are the hardware limitations of the printer. A couple examples of hardware limitations are the inherent accuracy of the substrate stage movement or movement of the inkjet cartridge. Typically these positional limitations are on the order of 5 to 10 microns ($\mu m$) for commercially available printers today. Repeatable printing of lines with spacings below these values is unlikely without other process improvements.

Figure 1:
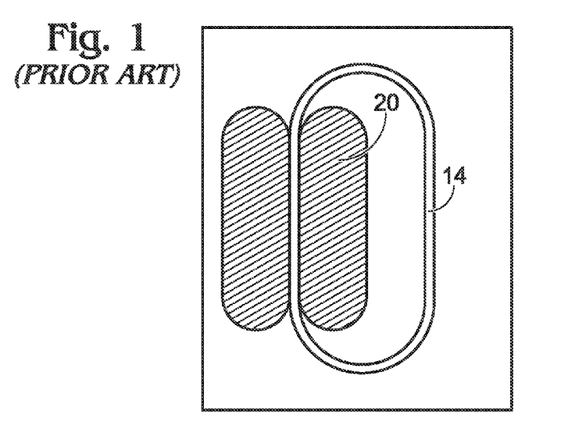
FIG. 1 is a plan view of a process that takes advantage of the coffee staining behavior of printed fluoropolymer (prior art).

FIG. 1 is a plan view of a process that takes advantage of the coffee staining behavior of printed fluoropolymer (prior art). As described by Kawase Takeo in U.S. Pat. No. 6,838,361, fluoropolymer 14 is printed and dry etched to define a fluoropolymer ridge in the shape of a racetrack. This ridge is used to separate a printed ink line 20 on either side of the fluoropolymer ridge. In this way a source and drain metal line are printed with a gap equal to the width of the fluoropolymer ridge. One problem with this approach is the reliance upon the drop placement accuracy of the inkjet printer to determine the relative amounts of ink that fall on either side of the fluoropolymer ridge. If the printed metal line is not centered on the ridge, the differences in ink volume are asymmetrically distributed on either side of the ridge. This has device consequences such as source/drain lines with different widths, electrical conductance, trace height, and surface roughness to name a few.

Another problem with the above-described method is the requirement of a dry etch to remove the residual fluoropolymer material from the center of the racetrack structure. It is not clear whether the surface energy of the substrate inside and outside of the racetrack structure are equivalent after this dry etch process. If different surface energy characteristics exist in these two areas the metal precursor ink spreads in different ways causing again the source and drain lines of the TFT to have different characteristics.

It would be advantageous if the placement and shape of printed ink structures could be more precisely controlled.

It would be advantageous if the placement and shape of printed ink structure was less dependent upon printer drop placement tolerances.

SUMMARY OF THE INVENTION

Disclosed herein is a method of consistently printing conductive lines with narrow line spacings by temporarily adding a printed fluoropolymer mask material between the source and drain lines. The fluoropolymer mask layer determines the line spacing rather than the drop placement accuracy of the inkjet printer. Thin film transistor (TFT) drain current is generally considered to be inversely proportional to the channel length of the device. So in order to improve the ON current and switching speed, either semiconductor performance can be improved, e.g. electron mobility, or the channel length reduced. This issue becomes even more important in case of display backplanes where there is a need to minimize the footprint of the backplane circuits, and thus increasing the device channel width is not a desirable option. With a digital fabrication technique such as inkjet printing, the channel length of a printed device is determined by how close two adjacent electrode lines can be printed without the lines merging along their lengths, for example. The drop placement and stage movement limitations of commercially available inkjet printers are on the order of 5 to 10 microns ($\mu m$), although channel lengths below 30 $\mu m$ are difficult to produce and are not reproducible with current commercially available inkjet printers and ink formulations. Placement tolerances of better than 5 $\mu m$ can be readily realized using the method disclosed herein.

Accordingly, a method is provided for controlling the channel length in a TFT. The method provides a substrate with a top surface, and forms a printed ink first source/drain (S/D) structure, using a primary ink, with a first edge overlying the substrate top surface. A fluoropolymer mask is deposited to cover the first S/D structure. A boundary region is formed between a first edge of the fluoropolymer mask and the first edge of the printed ink first S/D structure, having a width. Then, the primary ink is printed at least partially overlying the boundary region, forming a printed ink second S/D structure on the substrate top surface, having a first edge adjacent to the fluoropolymer mask first edge. After removing the fluoropolymer mask, the printed ink first S/D structure first edge is left separated from the printed ink second S/D structure first edge by a space equal to the boundary region width. Subsequently, a semiconductor channel is formed partially overlying the printed ink first S/D structure and the printed ink second S/D structure, having a channel length equal to the boundary region width. A gate dielectric is formed overlying the channel, printed ink first S/D region, and printed ink second S/D region. A gate electrode is formed overlying the gate dielectric.

Additional details of the above-described method, a method for controlling the separation between printed ink structures, and a minimum channel length TFT are provided below.

DETAILED DESCRIPTION

Figure 2A:
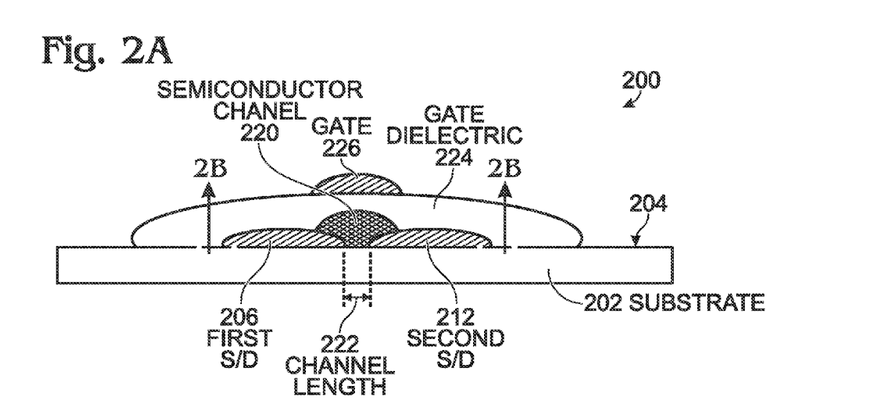
FIGS. 2A and 2B are, respectively, partial cross-sectional and plan views of a thin-film transistor (TFT) with a minimal channel length.
Figure 2B:
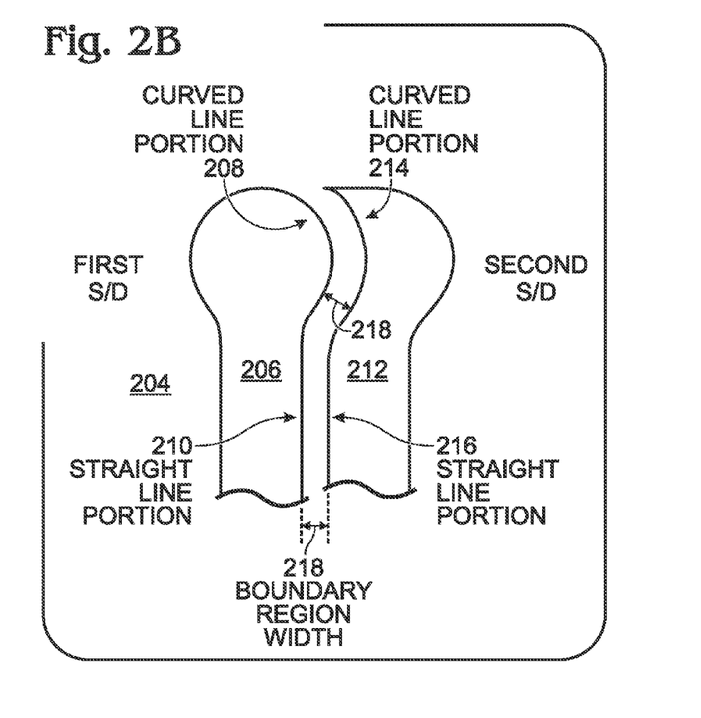

FIGS. 2A and 2B are, respectively, partial cross-sectional and plan views of a thin-film transistor (TFT) with a minimal channel length. The TFT 200 comprises a substrate 202 with a top surface 204. A printed ink first source/drain (S/D) 206 with a curved line portion 208 and a straight line portion 210 overlies the substrate top surface 204. In some aspects, an insulation layer (not shown) may be interposed between the substrate and the S/D regions. A printed ink second S/D 212 also overlies the substrate top surface 204, having a curved edge portion 214 adjacent to, and matching the shape the printed ink first S/D curved edge portion 208. The printed ink second S/D 212 has a straight line 216 portion adjacent to, and matching the shape of the printed ink first S/D straight line portion 210. The printed ink second S/D 212 is separated from the printed ink first S/D 206 by a uniform boundary region width 218. As can be seen, the uniform boundary region width has a shape matching the printed ink first S/D curved edge 208 and straight line 210 portions. Note: in the event that the first S/D is formed from only straight line portions, the second S/D is likewise be formed from only straight line portions, and is separated from the first S/D by a boundary region comprised of only straight line edges.

A semiconductor channel 220 partially overlies the printed ink first S/D 206 and the printed ink second S/D 212, having a uniform channel length 222 matching the boundary region width 218. The semiconductor channel 220 can be deposited using a number of means including spin coating. A gate dielectric 224 overlies the channel 220, printed ink first S/D region 206, and printed ink second S/D region 212. A gate electrode 226 overlies the gate dielectric 224. The gate electrode may be a metal, and it may be deposited using a printing method.

As explained in more detail below, the lower limit to the channel length 222 is equal to the thickness of the fluoropolymer dielectric mask used in the fabrication process, which may have a thickness in the range of 200-500 nanometers (nm). This channel length is much smaller than achievable with conventional printing processes. Alternatively, the lower limit of the channel length is related to the drop placement accuracy of an inkjet printer. Commercial printers can certainly obtain drop placement accuracies of around 5 µm. Practically though, 5 µm channel lengths are difficult to achieve with printing methods due to drop placement defects, surface defects, and print defects. A fabrication process using the fluoropolymer mask described below can reasonably bypass these issues and enable, at a minimum, a 5 µm channel length. Another factor affecting the boundary region width is the spread of the fluoropolymer 302 over the substrate surface 204.

Functional Description

Figure 3A:
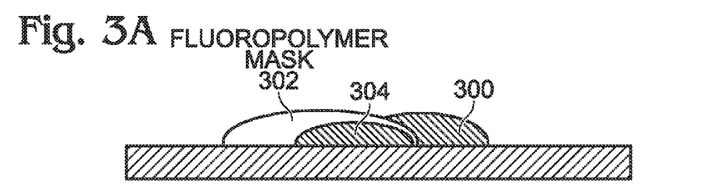
FIGS. 3A and 3B depict steps in a fluoropolymer mask expelling material to an adjacent region.
Figure 3B:
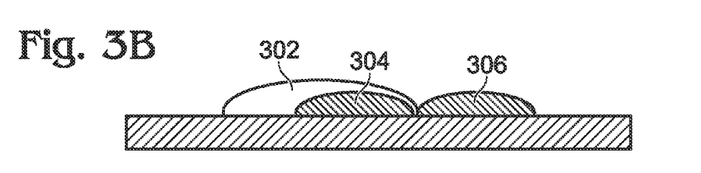
Figure 4A:
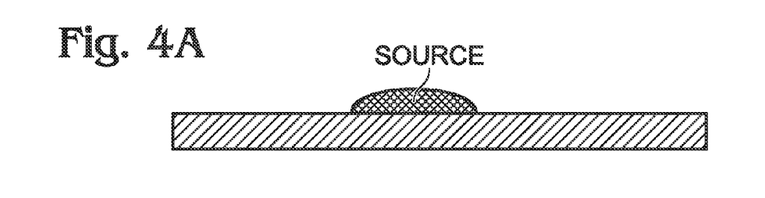
FIGS. 4A through 4D depict steps in the formation of a TFT channel length using a fluoropolymer mask.
Figure 4B:
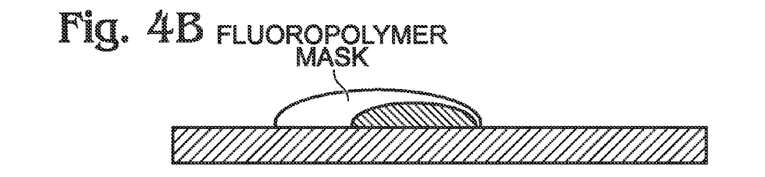
Figure 4C:
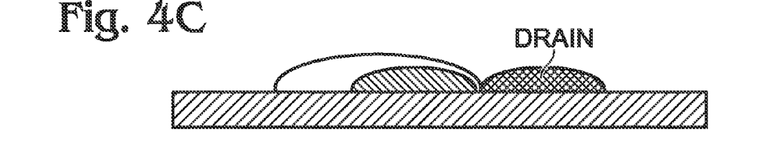
Figure 4D:
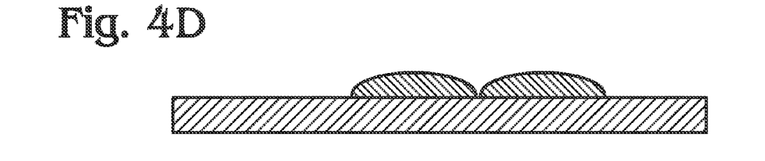

FIGS. 3A and 3B depict steps in a fluoropolymer mask expelling material to an adjacent region. An inkjet printed ink 300 (e.g. a TFT drain metal line) fails to wet the fluoropolymer mask material 302 and is expelled to the region next to the fluoropolymer mask. The result is a line (e.g., a TFT drain metal line) 306 adjacent to the previously printed TFT source metal line 304.

One advantage of the methods outlined herein is that the constraints on the drop placement accuracy of the inkjet printer are significantly relaxed. The placement of the printed metal drops can be less accurate and less precise because the metal precursor ink tends to roll off of fluoropolymer mask material, as shown in FIGS. 3A and 3B. The fluoropolymer mask material has a low enough surface energy that the metal precursor ink de-wets the surface where it is in contact with the fluoropolymer. The effect is that, independent of where the metal precursor ink drops land on, or near the fluoropolymer mask layer, the second printed metal line ends up adjacent to the first printed metal line with a gap that is determined by the properties of the fluoropolymer mask alone.

In contrast to the process described above in FIG. 1, an etch step is not required prior to the second line print with the method described herein. The substrate surface characteristics presented to the first printed line are identical to the surface characteristics presented to the second printed line. In this way, the characteristics of the two printed metal lines are equivalent.

Another unique aspect of the method described herein is that printed metal layers are not affected by the fluorosolvent used in the fluoropolymer mask layer. This fact allows the print of the mask layer to be reworked if there is a problem in printing without affecting the existing metal layer. The fluoropolymer mask can be printed and stripped from the surface without affecting the ultimate device performance. Additionally, once the source and drain metal lines have been printed and solvents removed by heating, the fluorosolvent completely dissolves the mask layer leaving behind a printed metal source and drain pattern.

The TFT channel length is determined by the placement of the fluoropolymer mask layer on the first printed metal layer. The surface characteristics of the first metal line and the substrate can be tuned such that the fluoropolymer mask layer preferentially wets the metal material only and is expelled from the exposed substrate surface. It has been observed that there is a higher affinity for the fluoropolymer to wet a metal line than to wet a substrate. This characteristic can be optimized to additionally minimize a TFT channel length while still realizing the advantages of this technique, such as eliminating the possibility of a first metal line electrically shorting with a subsequently formed second metal line.

FIGS. 4A through 4D depict steps in the formation of a TFT channel length using a fluoropolymer mask. The steps have been demonstrated by inkjet printing with Dimatix DMP2800 materials printer on a glass substrate. In Step 1 (FIG. 4A) an inkjet printer prints a TFT source line (e.g. Sunjet U5603 silver nanoparticle ink). Step 2 hot plate anneals—120° C., for 5 minutes. In Step 3 (FIG. 4B) a fluoropolymer mask material is inkjet printed (e.g. DuPont AF1600 diluted 1:5 parts by volume in 3M FC40 fluorosolvent). Step 4 hot plate anneals—120° C., for 1 minute. In Step 5 (FIG. 4C) a TFT drain line is inkjet printed (e.g. Sunjet U5603 silver nanoparticle ink) and Step 6 hot plate anneals—120° C., for 1 minute. In Step 7 (FIG. 4D) the fluoropolymer mask material is stripped by immersion in FC40, for 2 minutes. Step 8 hot plate anneals—120° C., for 30 minutes.

Figure 5A:
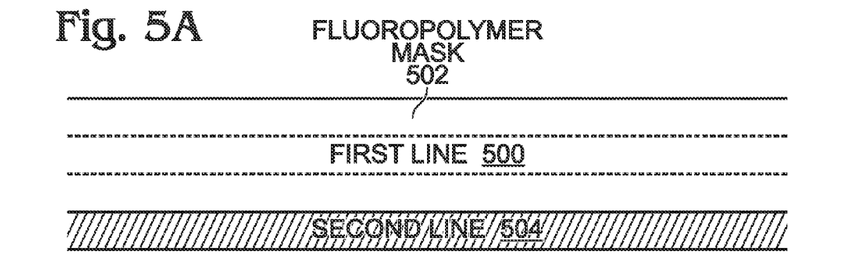
FIGS. 5A and 5B are plan view optical microscope image representations of source and drain lines formed using the process described in FIGS. 4A through 4D.
Figure 5B:
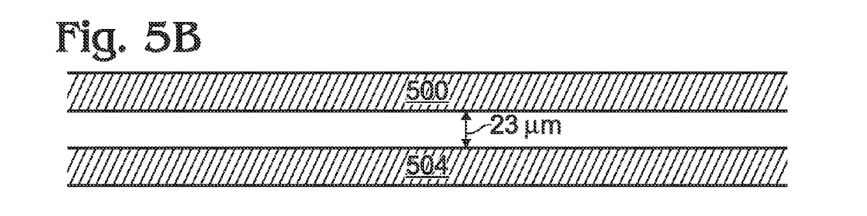

FIGS. 5A and 5B are plan view optical microscope image representations of source and drain lines formed using the process described in FIGS. 4A through 4D. FIG. 5A depicts the printed metal lines and fluoropolymer mask layer after Step 5 described in the previous process flow, prior to solvent removal with hot plate anneal. The first metal line 500 is depicted in phantom since it is covered by the fluoropolymer mask 502. All of the ink printed in the second metal line 504 print de-wetted completely from the fluoropolymer mask layer and ended up adjacent to the first printed metal line. Intentional overlap was also investigated and in all cases the metal of the second print was adjacent to the first print with no merging of the first and the second prints due to complete coverage of the fluoropolymer mask layer. The channel gap produced by this method was uniform along the length of the printed lines.

FIG. 5B depicts the printed metal lines after the final processing step, Step 8 in the previously described process flow. The final line widths are identical to each other and are similar to what is observed for conventional inkjet printing of metal nanoparticle ink, except for a significant reduction in the line spacing. The drawings depict a consistent line spacing of 23 µm. The edge defined by the fluoropolymer bank layer is well defined. The fluoropolymer bank layer has been completely removed by the immersion in fluorosolvent with no effect on the printed metal lines.

Figure 6:
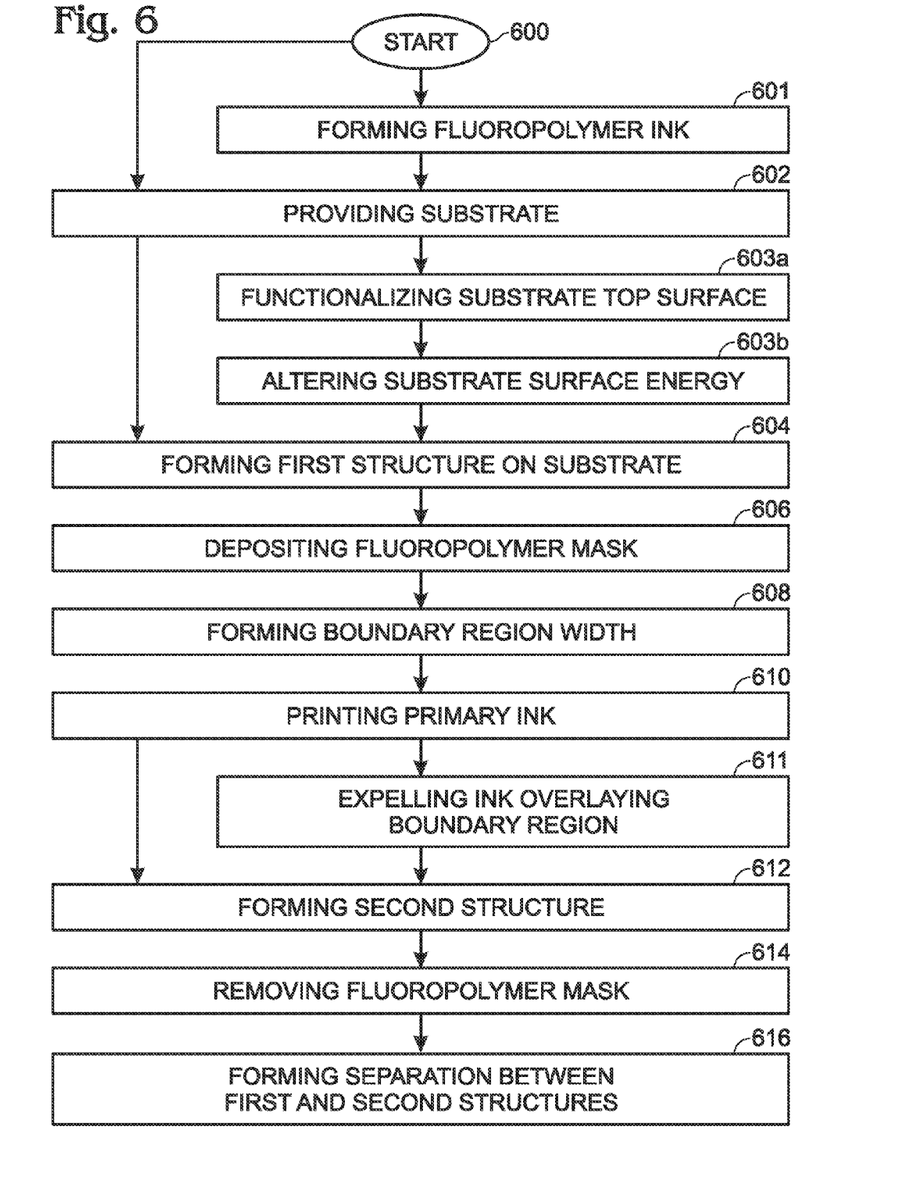
FIG. 6 is a flowchart illustrating a method for controlling the separation between printed ink structures.

FIG. 6 is a flowchart illustrating a method for controlling the separation between printed ink structures. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 600.

Step 602 provides a substrate with a top surface. Step 604 forms a first structure with a first edge overlying the substrate top surface. Step 606 deposits a fluoropolymer mask to cover the first structure. Step 608 forms a boundary region, between a first edge of the fluoropolymer mask and the first edge of the first structure, having a width. Step 610 prints a primary ink at least partially overlying the boundary region. As used herein, the term "primary ink" refers to an ink having some property of interest. In the case of a TFT, the primary ink is a conductive layer containing metal nanoparticles or organometallic precursors for forming source/drain contacts.

In one aspect, subsequent to Step 610, Step 611 expels the printed ink overlying the boundary region in response to the low surface energy of the fluoropolymer mask. Step 612 forms a printed ink second structure having a first edge adjacent to the fluoropolymer mask first edge. Subsequent to forming the printed ink second structure, Step 614 removes the fluoropolymer mask. Step 616 leaves the first structure first edge separated from the printed ink second structure first edge by a space equal to the boundary region width.

In one aspect, forming the first structure in Step 604 includes forming a printed ink first structure having at least one straight line portion. The printed ink first structure may, for example, be an electrically conductive printed ink first line. Likewise, Step 612 may form an electrically conductive printed ink second line. Then, leaving the first structure separated from the printed ink second structure by a space equal to the boundary region width in Step 616 includes leaving the electrically conductive printed ink first line separated from the electrically conductive printed ink second line by a line gap having the boundary region width.

In another aspect, Step 604 prints the electrically conductive printed ink first line with a curved edge portion, in addition to the straight line portion. For example, the curved edge portion may occur as a result of initially printing a portion of the electrically conductive printed ink first line with an oval shape having the curved edge portion, and subsequently printing the electrically conductive printed ink first line with the straight line portion. It is well known that due to limitations associated with digital printing, the ink, and the receiving surface, that the initial deposition of ink used to print a straight line may have a "bulge" or oval shape. Therefore, Step 612 prints the electrically conductive printed ink second line with a curved edge portion adjacent to, and matching the shape of the electrically conductive printed ink first line curved edge portion (see FIG. 2B). Then, Step 616 leaves the electrically conductive printed ink first line curved edge portion separated from the electrically conductive printed ink second line curved edge portion by a curve edge line gap having a uniform boundary region width that matches the shape of the electrically conductive printed ink first line curved edge portion.

In one aspect, Step 601 forms a fluoropolymer ink with a first viscosity. Then, Step 606 deposits the fluoropolymer ink, and Step 608 forms the boundary region with a width responsive to the fluoropolymer first viscosity. In another aspect, Step 603a functionalizes the substrate top surface using a UV-ozone, plasma, or self-assembled monolayer (SAM) treatment, and Step 603b alters the substrate top surface energy. Then, Step 608 forms the boundary region with a reduced width in response to decreasing the surface energy of the substrate top surface.

In a different aspect, depositing the fluoropolymer mask in Step 606 includes depositing the fluoropolymer mask using a printer deposition process with a printer tolerance error of X. Then, Step 608 forms the boundary region with a width (i.e. maximum width) equal to X plus the thickness of the fluoropolymer mask.

Figure 7:
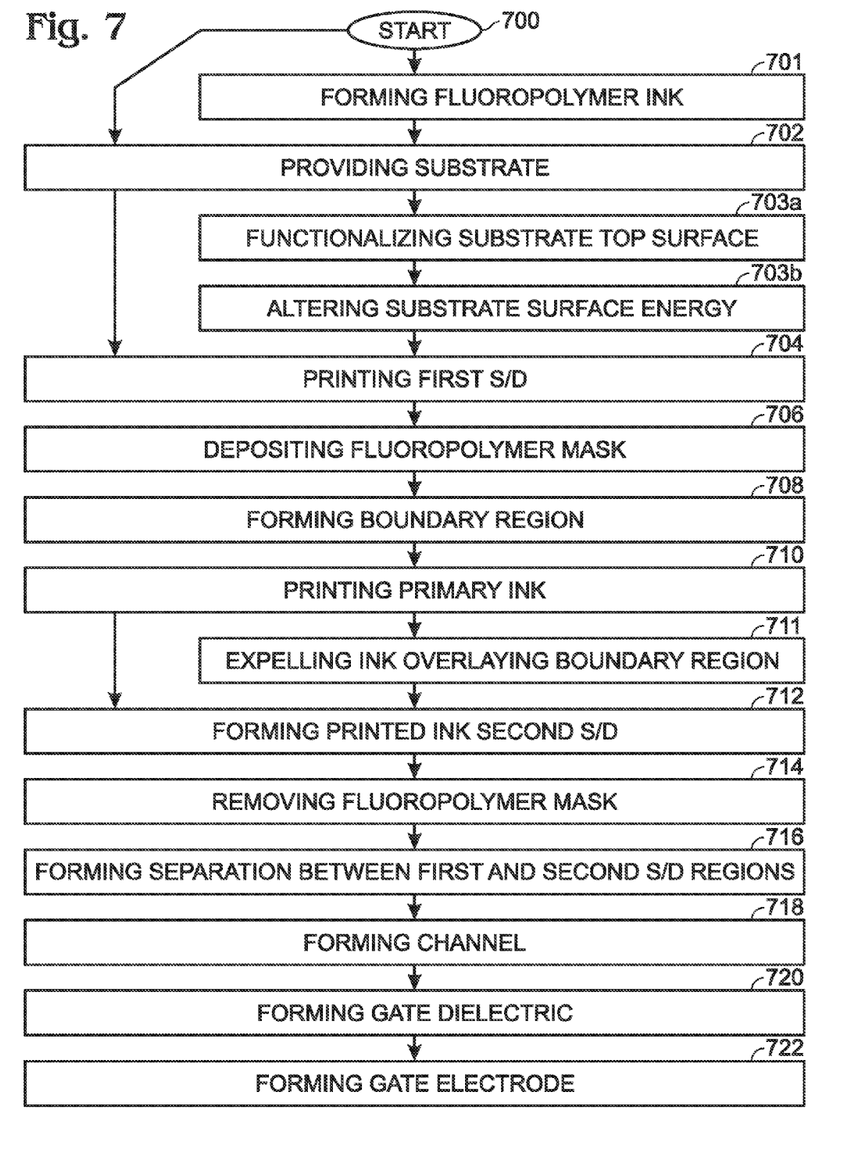
FIG. 7 is a flowchart illustrating a method for controlling the channel length in a TFT.

FIG. 7 is a flowchart illustrating a method for controlling the channel length in a TFT. The method begins at Step 700. Step 702 provides a substrate with a top surface. Step 704 forms a printed ink first source/drain (S/D) structure with a first edge overlying the substrate top surface. Step 706 deposits a fluoropolymer mask to cover the first S/D structure. Step 708 forms a boundary region, between a first edge of the fluoropolymer mask and the first edge of the printed ink first S/D structure, having a width. Step 710 prints a primary ink, at least partially overlying the boundary region. In one aspect, subsequent to Step 710, Step 711 expels the printed ink overlying the boundary region in response to a low surface energy of the fluoropolymer mask.

Step 712 forms a printed ink second S/D structure on the substrate top surface, having a first edge adjacent to the fluoropolymer mask first edge. Step 714 removes the fluoropolymer mask. Step 716 leaves the printed ink first S/D structure first edge separated from the printed ink second S/D structure first edge by a space equal to the boundary region width. Step 718 forms a semiconductor channel partially overlying the printed ink first S/D structure and the printed ink second S/D structure, having a channel length equal to the boundary region width. Step 720 forms a gate dielectric overlying the channel, printed ink first S/D region, and printed ink second S/D region. Step 722 forms a gate electrode overlying the gate dielectric.

In one aspect, forming the printed ink first S/D structure in Step 704 includes forming an electrically conductive printed ink first line having at least one straight line portion (see 210, FIG. 2B). Likewise, forming the printed ink second S/D structure in Step 712 includes forming an electrically conductive printed ink second line (see 216, FIG. 2D). Then, leaving the printed ink first S/D structure first edge separated from the printed ink second S/D structure first edge by a space equal to the boundary region width in Step 716 includes leaving a printed ink first S/D line separated from a printed ink second S/D line by a line gap having the boundary region width.

In another aspect, Step 704 additionally prints the printed ink first S/D line with a curved edge portion (see 208, FIG. 2B), and Step 712 prints the printed ink second S/D line with a curved edge portion (see 214, FIG. 2B) adjacent to, and matching the shape of the printed ink first S/D line curved edge portion. Then, Step 716 includes separating the printed ink first S/D line curved edge portion from the printed ink second S/D line curved edge portion by a curve edge line gap having a uniform boundary region width and matching the shape of the electrically printed ink first S/D line curved edge portion. For example, Step 704 may print an initial portion of the printed ink first S/D with an oval shape having the curved edge portion, and a subsequent portion of the printed ink first S/D with the straight line portion.

In one aspect, Step 701 forms a fluoropolymer ink with a first viscosity. Then, Step 706 deposits the fluoropolymer ink, and Step 708 forms the boundary region with a width responsive to the fluoropolymer first viscosity. In another aspect, Step 703a functionalizes the substrate top surface using a UV-ozone, plasma, or self-assembled monolayer (SAM) treatment, and Step 703b alters the substrate top surface energy. Then, Step 708 forms the boundary region with a reduced width in response to decreasing the surface energy of the substrate top surface.

In a different aspect, depositing the fluoropolymer mask in Step 706 includes depositing the fluoropolymer mask using a printer deposition process with a printer tolerance error of X. Then, Step 708 forms the boundary region with a width equal to X plus the thickness of the fluoropolymer mask.

A method for controlling the spacing between printed lines has been presented along with a TFT having a fluoropolymer mask controlled channel length. Examples of particular materials and process steps have been presented to illustrate the invention. However, the invention is not limited to merely these examples. Other variations and embodiments of the invention will occur to those skilled in the art.

We claim:

1. A method for controlling the separation between printed ink structures, the method comprising:
   providing a substrate with a top surface;
   forming a first structure with a first edge overlying the substrate top surface;
   inkjet printing a fluoropolymer mask to cover the first structure;
   forming a boundary region, between a first edge of the fluoropolymer mask and the first edge of the first structure, having a width;
   printing a primary ink at least partially overlying the boundary region; and,
   forming a printed ink second structure having a first edge adjacent to the fluoropolymer mask first edge.

2. The method of claim 1 further comprising:
   subsequent to forming the printed ink second structure, removing the fluoropolymer mask; and,
   leaving the first structure first edge separated from the printed ink second structure first edge by a space equal to the boundary region width.

3. The method of claim 2 wherein forming the first structure includes forming a printed ink first structure having at least one straight line portion.

4. The method of claim 3 wherein forming the printed ink first structure includes forming an electrically conductive printed ink first line; and,
   wherein forming the printed ink second structure includes forming an electrically conductive printed ink second line.

5. The method of claim 4 wherein leaving the first structure separated from the printed ink second structure by a space equal to the boundary region width includes leaving the electrically conductive printed ink first line separated from the electrically conductive printed ink second line by a line gap having the boundary region width.

6. The method of claim 5 wherein forming the electrically conductive printed ink first line includes printing the electrically conductive printed ink first line with a curved edge portion;
   wherein forming the electrically conductive printed ink second line includes printing the electrically conductive printed ink second line with a curved edge portion adjacent to, and matching a shape of the electrically conductive printed ink first line curved edge portion; and,
   wherein leaving the electrically conductive printed ink first line separated from the electrically conductive printed ink second line by the line gap includes separating the electrically conductive printed ink first line curved edge portion from the electrically conductive printed ink second line curved edge portion by a curve edge line gap having a uniform boundary region width and matching the shape of the electrically conductive printed ink first line curved edge portion.

7. The method of claim 6 wherein printing the electrically conductive printed ink first line with the curved edge portion and the straight line portion includes printing an initial portion of the electrically conductive printed ink first line with an oval shape having the curved edge portion, and a subsequent portion of the electrically conductive printed ink first line with the straight line portion.

8. The method of claim 1 further comprising:
   subsequent to printing the primary ink at least partially overlying the boundary region, expelling the printed ink overlying the boundary region in response to a low surface energy of the fluoropolymer mask.

9. The method of claim 1 further comprising:
   forming a fluoropolymer ink with a first viscosity;
   wherein forming the fluoropolymer mask includes depositing the fluoropolymer ink; and,
   wherein forming the boundary region includes forming the boundary region with a width responsive to the fluoropolymer first viscosity.

10. The method of claim 1 further comprising:
    functionalizing the substrate top surface using a process selected from a group consisting of UV-ozone, plasma, and self-assembled monolayer (SAM) treatments;
    altering a substrate top surface energy; and,
    wherein forming the boundary region width includes reducing the boundary region width in response to decreasing the surface energy of the substrate top surface.

11. The method of claim 1 wherein inkjet printing the fluoropolymer mask includes depositing the fluoropolymer mask using a printer deposition process with a printer tolerance error of X; and,
    wherein forming the boundary region, between the first edge of the fluoropolymer mask and the first edge of the first structure, includes forming the boundary region with a width equal to X plus a thickness of the fluoropolymer mask.

12. A method for controlling the channel length in a thin-film transistor (TFT), the method comprising:
    providing a substrate with a top surface;
    forming a printed ink first source/drain (S/D) structure with a first edge overlying the substrate top surface;

inkjet printing a fluoropolymer mask to cover the first S/D structure;

forming a boundary region, between a first edge of the fluoropolymer mask and the first edge of the printed ink first S/D structure, having a width;

printing a primary ink at least partially overlying the boundary region;

forming a printed ink second S/D structure on the substrate top surface, having a first edge adjacent to the fluoropolymer mask first edge;

removing the fluoropolymer mask;

leaving the printed ink first S/D structure first edge separated from the printed ink second S/D structure first edge by a space equal to the boundary region width; and, forming a semiconductor channel partially overlying the printed ink first S/D structure and the printed ink second S/D structure, having a channel length equal to the boundary region width.

13. The method of claim 12 further comprising:
forming a gate dielectric overlying the channel, printed ink first S/D region, and printed ink second S/D region; and,
forming a gate electrode overlying the gate dielectric.

14. The method of claim 12 wherein forming the printed ink first S/D structure includes forming an electrically conductive printed ink first line having at least one straight line portion; and,
wherein forming the printed ink second S/D structure includes forming an electrically conductive printed ink second line.

15. The method of claim 14 wherein leaving the printed ink first S/D structure first edge separated from the printed ink second S/D structure first edge by a space equal to the boundary region width includes leaving a printed ink first S/D line separated from a printed ink second S/D line by a line gap having the boundary region width.

16. The method of claim 15 wherein forming the printed ink first S/D line includes printing the printed ink first S/D line with a curved edge portion;
wherein forming the printed ink second S/D line includes printing the printed ink second S/D line with a curved edge portion adjacent to, and matching a shape of the printed ink first S/D line curved edge portion; and,
wherein leaving the printed ink first S/D line separated from the printed ink second S/D line by the line gap includes separating the printed ink first S/D line curved edge portion from the printed ink second S/D line curved edge portion by a curve edge line gap having a uniform boundary region width and matching the shape of the electrically printed ink first S/D line curved edge portion.

17. The method of claim 16 wherein printing the printed ink first S/D with the curved edge portion and the straight line portion includes printing an initial portion of the printed ink first S/D with an oval shape having the curved edge portion, and a subsequent portion of the printed ink first S/D with the straight line portion.

18. The method of claim 12 further comprising:
subsequent to printing the primary ink at least partially overlying the boundary region, expelling the printed ink overlying the boundary region in response to a low surface energy of the fluoropolymer mask.

19. The method of claim 12 further comprising:
forming a fluoropolymer ink with a first viscosity;
wherein forming the fluoropolymer mask includes depositing the fluoropolymer ink; and,
wherein forming the boundary region includes forming the boundary region with a width responsive to the fluoropolymer first viscosity.

20. The method of claim 12 further comprising:
functionalizing the substrate top surface using a process selected from a group consisting of UV-ozone, plasma, and self-assembled monolayer (SAM) treatments;
altering a substrate top surface energy; and,
wherein forming the boundary region width includes reducing the boundary region width in response to a surface energy decrease in the substrate top surface.

21. The method of claim 12 wherein inkjet printing the fluoropolymer mask includes depositing the fluoropolymer mask using a printer deposition process with a printer tolerance error of X; and,
wherein forming the boundary region, between the first edge of the fluoropolymer mask and the first edge of the printed ink first S/D structure, includes forming the boundary region with a width equal to X plus a thickness of the fluoropolymer mask.

22. A method for controlling the separation between printed ink structures, the method comprising:
providing a substrate with a top surface;
forming a first structure with a first edge overlying the substrate top surface;
depositing a fluoropolymer mask to cover the first structure using a printer deposition process with a printer tolerance error of X;
forming a boundary region, between a first edge of the fluoropolymer mask and the first edge of the first structure, having a width equal to X plus a thickness of the fluoropolymer mask;
printing a primary ink at least partially overlying the boundary region; and,
forming a printed ink second structure having a first edge adjacent to the fluoropolymer mask first edge.

23. A method for controlling the channel length in a thin-film transistor (TFT), the method comprising:
providing a substrate with a top surface;
forming a printed ink first source/drain (S/D) structure with a first edge overlying the substrate top surface;
depositing a fluoropolymer mask to cover the first S/D structure using a printer deposition process with a printer tolerance error of X;
forming a boundary region, between a first edge of the fluoropolymer mask and the first edge of the printed ink first S/D structure, having a width equal to X plus a thickness of the fluoropolymer mask;
printing a primary ink at least partially overlying the boundary region;
forming a printed ink second S/D structure on the substrate top surface, having a first edge adjacent to the fluoropolymer mask first edge;
removing the fluoropolymer mask;
leaving the printed ink first S/D structure first edge separated from the printed ink second S/D structure first edge by a space equal to the boundary region width; and,
forming a semiconductor channel partially overlying the printed ink first S/D structure and the printed ink second S/D structure, having a channel length equal to the boundary region width.

* * * * *